US009083424B2

(12) United States Patent
Otis et al.

(10) Patent No.: US 9,083,424 B2
(45) Date of Patent: *Jul. 14, 2015

(54) FREQUENCY MULTIPLYING TRANSCEIVER

(71) Applicant: University of Washington through its Center for Commercialization, Seattle, WA (US)

(72) Inventors: Brian Patrick Otis, Seattle, WA (US); Jagdish Narayan Pandey, Uttar Prades (IN)

(73) Assignee: University of Washington Through its Center for Commercilization, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/461,120

(22) Filed: Aug. 15, 2014

(65) Prior Publication Data
US 2014/0357199 A1    Dec. 4, 2014

Related U.S. Application Data

(63) Continuation of application No. 13/636,056, filed as application No. PCT/US2011/029646 on Mar. 23, 2011, now Pat. No. 8,811,926.

(60) Provisional application No. 61/316,784, filed on Mar. 23, 2010, provisional application No. 61/316,790, filed on Mar. 23, 2010, provisional application No. 61/410,176, filed on Nov. 4, 2010.

(51) Int. Cl.
*H04B 1/06* (2006.01)
*H04B 7/00* (2006.01)
(Continued)

(52) U.S. Cl.
CPC .. *H04B 1/16* (2013.01); *G06F 7/68* (2013.01); *H03C 3/00* (2013.01); *H03D 3/00* (2013.01); *H03K 3/0315* (2013.01); *H03K 5/00006* (2013.01); *H04B 1/38* (2013.01)

(58) Field of Classification Search
None
See application file for complete search history.

(56) References Cited

U.S. PATENT DOCUMENTS 5,546,056 A * 8/1996 Tokumitsu .................... 331/172
6,535,037 B2 * 3/2003 Maligeorgos ................. 327/116
(Continued)

FOREIGN PATENT DOCUMENTS

EP        0665652    *  2/1995    ............... H03L 7/24

OTHER PUBLICATIONS

Kim, et al., (2008) A 2.6mW 370MHz-to-2.5GHz Open-Loop Quadrature Clock Generator, Solid-State Circuits Conference, 2008, Digest of Technical Papers, IEEE, p. 458-627.

(Continued)

*Primary Examiner* — Tuan A Tran
(74) *Attorney, Agent, or Firm* — McDonnell Boehnen Hulbert & Berghoff LLP

(57) ABSTRACT

Described herein is a wireless transceiver and related method that enables ultra low power transmission and reception of wireless communications. In an example embodiment of the wireless transceiver, the wireless transceiver receives a first-reference signal having a first-reference frequency. The wireless transceiver then uses the first-reference signal to injection lock a local oscillator, which provides a set of oscillation signals each having an oscillation frequency that is equal to the first-reference frequency, and each having equally spaced phases. Then the wireless transceiver combines the set of oscillation signals into an output signal having an output frequency that is one of (i) a multiple of the first-reference frequency (in accordance with a transmitter implementation) or (ii) a difference of (a) a second-reference frequency of a second-reference signal and (b) a multiple of the first-reference frequency (in accordance with a receiver implementation).

20 Claims, 9 Drawing Sheets

(51) Int. Cl.
*H04B 1/16* (2006.01)
*G06F 7/68* (2006.01)
*H03C 3/00* (2006.01)
*H03D 3/00* (2006.01)
*H03K 3/03* (2006.01)
*H03K 5/00* (2006.01)
*H04B 1/38* (2015.01)

(56) References Cited

U.S. PATENT DOCUMENTS

| | | | |
|---|---|---|---|
| 6,617,936 B2* | 9/2003 | Dally et al. | 331/57 |
| 7,078,979 B2* | 7/2006 | Dally et al. | 331/57 |
| 7,138,879 B2* | 11/2006 | Su | 331/74 |
| 7,522,008 B2* | 4/2009 | Jang et al. | 331/172 |
| 7,705,686 B2* | 4/2010 | Jang et al. | 331/57 |
| 7,961,058 B2* | 6/2011 | Luong et al. | 331/74 |
| 8,487,670 B2* | 7/2013 | Fagg | 327/118 |
| 8,577,305 B1* | 11/2013 | Rossi et al. | 455/76 |
| 2002/0039039 A1 | 4/2002 | Maligeorgos et al. | |
| 2009/0081961 A1 | 3/2009 | Rofougaran et al. | |

OTHER PUBLICATIONS

Pandey, et al., (2009) "A BAW-enabled low-power 5x frequency multiplier," Ultrasonics Symposium (IUS), IEEE, p. 843-846.
Harrison, et al., (2007) "A Low-Power integrated circuit for a wireless 100-electrode neural recording system," IEEE Journal of Solid-State Circuits, 42:123-133.
Holleman, et al., (2007) "A sub-microwatt low-noise amplifier for neural recording," Proc IEEE Engineering and Biology Society Conference, p. 3930-3933.
Wattanapanitch, et al., (2007) "An energy-efficient micropower neural recording amplifier," IEEE transactions on biomedical circuits and Systems, 1:136-147.
Bohorquez, et al., (2008) "A 350uW CMOS MSK transmitter and 400uW OOK super-regenerative received for medical implant communications," IEEE Symposium on VSLI Circuits, p. 32-33.
Fang, et al., (2006) "A 1mW dual-chopper amplifier for 5Oug/Hz monolithic CMOS-MEMS capacitive accelerometer," Proc. Symp. VLSI Circuits, p. 59-60.
He, et al., (2008) "A CMOS readout circuit for SOI resonant accelerometer with 4-ug bias stability and 20ug/Hz resolution," IEEE J. Solid-State Circuits, 43(6): 1480-1490.
Schafft, (1973) "Testing and fabrication of wire-bond electrical connections:a comprehensive survey," U.S. National Bureau of Standards (1973), whole document.
International Search Report for PCT/US2011/029646, mailed Jul. 7, 2011.
Otis, et al. (2009) "Circuit techniques for wireless brain interfaces," IEEE Conf on Engineering in Medicine and Biology Society, pp. 3213-3216.
Yeager, et al., (2009) "Neural WISP: a wirelessly powered neural interface with 1 m range," IEEE Trans on Biomedical Circuits and Systems, 3(6): 379-387.
Moritz, et al., (2008) "Direct control of paralysed muscles by cortical neurons," Nature, 456(7222): 639-42.
Seiko Instruments, 2009. http://datasheet.sii-ic.com/en/voltage.regulator/S11L10.E.pdf.
Sodagar, et al., (2009) "An implantable 64-channel wireless microsystesm for single-unit neural recording," IEEE Journal of Solid States Circuits, 44(9):2591-2604.
Pandey, et al., (2010) "A 90uW MICS/ISM band transmitter with 22% global efficiency," IEEE RFIC, pp. 285-288.
Adler, et al., (1973) "A study of locking phenomenon is oscillators," Proc. of IEEE, pp. 1380-1385.
Shenghua, et al., (2007) "A novel ultra-low power temperature sensor for a novel temperature sensor for UHF RFID tag chip," Asian Solid-State Circuits Conference, pp. 464-467.

Kim, et al. (2007) "An EPC Gen 2 compatible passive/semi-active UHF RFID transponder with embedded FeRAM and temperature sensor," Asian Solid-State Circuits Conference, pp. 135-138.
Barnett, et al., (2006) "A 0.8V 1.52MHz MSVC Relaxation Oscillator with inverted mirror feedback references for UHF RFID," Custom Integrated Circuits Conference, pp. 769-772.
Su, et al., (2008) "A digital 1.6pJ/it chip identification circuit using process variations," Journal of Solid State Circuits, 43 (1):69-77.
Cilek,et al., (2008) "Ultra low power oscillator for UHF RFID transponder," Frequency Control Symposium, pp. 418-421.
Daly,et al., (2009) "A pulsed UWB receiver SoC for insect motion control," ISSCC Dig. Tech. Papers, pp. 200-201.
Denison, et al., (2007) "A 2uW 100nV/rtHz Chopper-Stabilized Instrumentation Amplifier for Chronic Measurement of Neural field Potentials," J. Solid-State Circuits, 42(12): pp. 2934-2945.
http://edocket.access.gpo.gov/cfr_2008/octqtr/47cfr15.242.htm, 2008.
http://encounternet.net/, printed Jun. 17, 2013.
Hofmann, et al., (1995) "General purpose telemetry for analog biomedical signals," IEEE Engineering in Medicine and Biology Magazine, 14(6): 772-775.
Bohorquez, et al., (2009) "A 350W CMOS MSK transmitter and 400 W OOK super-regenerative receiver for medical implant communications," IEEE Journal of Solid-State Circuits, 44(4):1248-1259.
Bradley, et al. (2006) "An ultra-low power, high performance medical implant communication system (MICS) transceiver for implantable devices," IEEE Biomedical Circuits and Systems (BioCAS), pp. 158-161.
Bae, et al., (2009) "A 490uW fully MICS compatible FBK transceiver for implantable devices," IEEE symposium on VLS1 Circuits, p. 36-37.
Melly, et al., (2001) "An ultralow-power UHF transceiver integrated in a standard digital CMOS process: transmitter," IEEE Journal of Solid-State Circuits, 36(3): 467-472.
Yeager, et al., (2010) "A 9.2uA Gen2 compatible UHF RFID sensing tag with -12dBm sensitivity and 1.25uVrms input referred noise floor," IEEE International Solid-State Circuits Conference (ISSCC), p. 52-54.
Roundy, et al. (2005) "Improving power output for vibration based energy scavengers," IEEE Pervasive Computing, 4 (1):28-36.
Rai et al, (2009) "A 500uW neural tag with 2uVrms AFE and frequency multiplying MCIS/ISM FSK transmitter," IEEE International Solid-State Circuits Conf (ISSCC), Feb. 2009, pp. 212-214.
Otis, (2005) "400uW-RX, 1.6mW-TX super-regenerative transceiver for wireless sensor networks," IEEE International Solid State Circuits Conference (ISSCC), Feb. 2005, 396-397.
Liu, et al., (2009) "A super-regenerative ASK receiver with ΔΣ pulse-width digitizer and SAR-based fast frequency calibration for MICS applications," IEEE symposium on VLSI Circuits, Jun. 2009, 425-433.
w3.antd.nist.gov/ban/15-08-0519-01-0006.pdf, 2008.
Porret, et al., (2001) "An ultra-low-power UHF transceiver integrated in a standard digital CMOS process:architecture and receiver," IEEE Journal of Solid-State Circuits, 36(3):452-466.
Zhuo, et al., (2005) "A capacitor cross-coupled common-gate low-noise amplifier," IEEE Transactions on Circuits and Systems II: Express Briefs, 52(12):875-870.
Vittoz, et al., (1988) "High-performance crystal oscillator circuits: theory and application," IEEE Journal of Solid-State Circuits, 23(3): 774-783.
Johansson, et al., (2004) "Perfomance of a radio link between a base station and a medical implant utilizing the MICS standard," IEEE International Conference on Engineering in Medicine and Biology Society, 1(1-5): 2113-2116.
Kinget, et al., (2002) "An injection-locking scheme for precision quadrature generation," IEEE Journal of Solid-State Circuits, 37(7):845-851.
Chien, et al., (2000) "A 900MHz local oscillator using a DLL-based frequency multiplier technique for PCS applications," IEEE Journal of Solid-State Circuits, 35(12):1996-1999.
Vauce, et al., (1982) "Fully integrated radio paging receiver," IEE Proceedings Communications, Radar and Signal Processing, 129(1): 2-6.

(56) References Cited

OTHER PUBLICATIONS

Barbour, et al., (2001) "Inertial sensor technology trends," Sensors Journal, IEEE, 1(4): 332-339.
Yazdi, et al. (1998) "Micromachined inertial sensors," Proceedings of IEEE, 86(8):1640-1659.
Paavola, et al. (2007) "A micropower interface ASIC, for a capacitive 3-axis micro-accelerometer," Solid State Circuits, IEEE Journal, 42(12):2651-2665.
Hindrichsen, et al., (2009) "Analytical model of PZT thick-film triaxial accelerometer for optimum design," Sensors Journal, IEEE, 9(4):1759-1766.
Bhola, et al., (2007) "A novel optical microring resonator accelerometer, "Sensors Journal, IEEE, 7(12): 557-561.
Ames, et al., (2007) "Erbium fiber laser accelerometer," Sensors Journal IEEE, 7(4): 557-561.
Liu, et al., (2001) "A high-precision, wide-bandwidth micro-machined tunneling accelerometer," Journal of Microelectromechanical Systems, 10(3): 425-433.
Takao, et al., (2001) "A CMOS integrated three-axis accelerometer fabricated with commercial submicrometer CMOS technology and bulk-micromachining," Electron Devices, IEEE Transactions, 48(9):1961-1968.
Amini, et al., (2006) "A 4.5-mW closed-loop $\Delta\Sigma$ micro-gravity CMOS SOI accelerometer," IEEE Journal of Solid-State Circuits, 41(12):2983-2991.
Lemkin, et al., (1999) A three-axis micromachined accelerometer with a CMOS position-sense interface and digital offset-trim electronics, IEEE Journal of Solid-State Circuits, 34(4): 456-468.
Marinis, et al., (2009) "Design and characterization of wirebonds for use in high shock environments," in Electronic Components and Technology Conference, 2009, ECTC 2009, 59th, May 2009, pp. 1414-1422.
Alimenti, et al., (2001) "Modeling and characterization of the bonding-wire interconnection," IEEE Transactions on Microwave Theory and Techniques, 49(1):142-150.
Boser, et al., (1996) "Surface micromachined accelerometers," IEEE Journal of Solid-State Circuits, 31(3): 366-375.
Leeson, (1966) "A simple model of feedback oscillator noise spectrum," Proceedings of the IEEE, 54(2): 329-330.
Sheimy, et al., (2008) "Analysis and modeling of inertial sensors using allan variance," IEEE Transactions on Instrumentation and Measurement, 57(1): 140-149.
Zhou, et al., (2005) "A CMOS passive mixer with low flicker noise for low-power direct-conversion receiver," IEEE Journal of Solid-State Circuits, 40(5): 1084-1093.

* cited by examiner

FREQUENCY MULTIPLYING TRANSCEIVER

RELATED APPLICATIONS

This application claims priority to: U.S. patent application Ser. No. 13/636056 filed Oct. 24, 2012, which is a US national phase filing of PCT Application Ser. No. PCT/US11/29646 filed Mar. 23, 2011, which claims priority to U.S. Provisional Patent Application Ser. No. 61/316,784, entitled Frequency Multiplying Transceiver, filed Mar. 23, 2010; U.S. Provisional Patent Application Serial No. 61/316,790, entitled Frequency Multiplying Transceiver, filed Mar. 23, 2010; and U.S. Provisional Patent Application Ser. No. 61/410,176, entitled Frequency Multiplying Transceiver, filed Nov. 4, 2010, all of which are incorporated by reference herein in their entirety.

BACKGROUND

Generally, wireless transceivers may be severely energy constrained as a result of, among other things, running off a small battery and/or energy scavenging techniques. Thus, as wireless-communication technologies have become more and more pervasive over recent years, so too has the demand for ultra-low power (ULP) wireless transceivers. ULP wireless transceivers have many applications including, as a few examples, as wireless-sensor networks (which may monitor, e.g., geographic areas, industrial processes, and/or transportation systems), body area networks (which may monitor, e.g., physiological conditions of a given patient), and remote controls (e.g., for use in multimedia devices and/or automotives). Many other examples of such applications exist as well.

Generally, a wireless transceiver may include a transmitter and a receiver, among other functional components. That is, a wireless transceiver may include a transmitter that is configured to carry out functions that may include data modulation and signal transmission. A wireless transceiver may also include a receiver that is configured to carry out functions that may include wirelessly receiving a signal and demodulating such a received signal.

While a wireless transceiver may be configured to perform a number of additional functions (e.g, sensing, data processing, data storage, and/or various additional communication functions), the power required by wireless transmission and receipt functions is typically a dominant component of the total power consumed by a wireless transceiver. Therefore, attempts to reduce the overall power consumption of wireless transceivers are commonly directed to improving techniques for reducing the amount of power used to carry out wireless transmission and receipt function.

One aspect of wireless transmission that may be particularly power intensive is carrier-signal generation. In an example transceiver, carrier signal-generation may involve frequency synthesis and data modulation at the carrier frequency, which may require high power expenditures. Common approaches to reducing the power consumed in carrier-signal generation (as well as other transmission functions) merely shift the power-consumption burden from the transmitter side of the transceiver to the receiver side of the transceiver. For instance, one approach to reducing the power consumed in carrier-signal generation during transmission on the transmitter side of the transceiver may be to replace a radio frequency (RF) phase-locked loop (PLL) with an open loop oscillator in the transceiver, which may be less power intensive but may also be less stable than the use of the PLL. However, such an approach requires that the transceiver devote extra power to frequency correction/calibration functions on the receiver side of the transceiver, and therefore does little to meaningfully reduce the total power consumed by the wireless transceiver. Thus, particularly in peer-to-peer applications in which it is desirable that network devices are capable of carrying out both transmission and receipt functions, common approaches to reducing the power consumed by wireless transceivers have proven inadequate.

For some wireless transceiver applications, it may also be desirable that the wireless transceiver be small in size and low in weight. One example of such an application is electromyography, which may involve the evaluation of the electrical activity produced by skeletal muscles by detection and recording of the electrical potential generated by muscle cells. Because electromyography requires on-body recording, it may be desirable to use sensors that are, among other things, small in size, low in weight, and robust/reliable.

SUMMARY OF THE INVENTION

Disclosed herein are methods, systems, and devices that enable low power transmission and reception of wireless communications by a wireless transceiver that is small in size and low in weight.

In one example, the wireless transceiver may be arranged to receive a low-frequency modulated reference signal, multiply the modulated reference signal using a local oscillator and edge combiner, and then provide the multiplied signal as a carrier signal to perform a transmission function. In another example, the wireless transceiver may be arranged to receive a low-frequency reference-clock signal and a high-frequency data signal, downconvert the high-frequency data signal using a virtual oscillator generated based on the low-frequency reference-clock signal, and then provide the downconverted signal for demodulation to perform a reception function. Other examples are possible as well.

Advantageously, the disclosed methods, systems, and devices may enable the wireless transceiver to avoid both frequency synthesis and modulation at a high frequency, which may result in dramatic reductions in power consumption. Further, the disclosed methods, systems, and devices may effectively employ the principle of edge combination to reduce power consumption in both transmission and receipt functions (rather than transferring the power burden from the transmission function to the receipt function). Other advantages may exist as well.

One embodiment of the disclosed methods, systems, and devices may take the form of a circuit that includes an oscillator circuit configured to provide a set of oscillation signals, each oscillation signal having an oscillation frequency; an injection-locking circuit coupled to the oscillator circuit, wherein the injection-locking circuit is configured to (i) receive a first-reference signal having a first-reference frequency and (ii) use the first-reference signal to injection lock the oscillator circuit, such that the oscillation frequency is equal to the first-reference frequency; and an edge-combining circuit coupled to the oscillator circuit, wherein the edge-combining circuit is configured to combine the set of oscillation signals into an output signal, wherein the output signal has an output frequency that is one of (i) a multiple of the first-reference frequency or (ii) a difference of (a) a second-reference frequency of a second-reference signal and (b) a multiple of the first-reference frequency.

The oscillator circuit may take various forms. In one example, the oscillator circuit may take the form of a ring-oscillator circuit having a set of delay elements, where the ring-oscillator circuit is configured to provide a respective one of the set of oscillation signals, such as oscillation signals $A_1, A_2 \ldots A_N$, at an output of a respective one of the set of delay elements.

Further, the injection-locking circuit may take various forms. In one example, the injection-locking circuit may include at least a first stage and a second stage, where the first stage is configured to provide a single-phase injection of the frequency of the reference signal to the oscillator circuit, and wherein the second stage is configured to provide a multi-phase symmetrical injection of the frequency of the reference signal to the oscillator circuit.

Further still, the edge-combining circuit may take various forms. In one example, the edge-combining circuit may be configured to generate a set of signal products $A_1A_2$, $A_2A_3 \ldots A_NA_1$ and generate a summation of the set of signal products to produce the output signal having an output frequency equal to the first-reference frequency multiplied by N. In another example, the edge-combining circuit may be configured to generate a set of signal products $A_1A_2, A_2A_3 \ldots A_NA_{\cdot}$; mix the set of signal products with the second-reference signal; and generate a summation of the mixed set of signal products to produce the output signal having an output frequency equal to the difference frequency.

Another embodiment of the disclosed methods, systems, and devices may take the form of a method that includes receiving a first-reference signal having a first-reference frequency; using the first-reference signal to injection lock a local oscillator that provides a set of oscillation signals each having an oscillation frequency, such that the oscillation frequency is equal to the first-reference frequency; and combining the set of oscillation signals into an output signal having an output frequency that is one of (i) a multiple of the first-reference frequency or (ii) a difference frequency that is a difference of (a) a second-reference frequency of a second-reference signal and (b) a multiple of the first-reference frequency.

Yet another embodiment of the disclosed methods, systems, and devices may take the form of an apparatus that includes means for providing a set of oscillation signals, each oscillation signal having an oscillation frequency; means for injection locking comprising means for (i) receiving a first-reference signal having a first-reference frequency and (ii) use the first-reference signal to injection lock the oscillator circuit, such that the oscillation frequency is equal to the first-reference frequency; and means for combining the set of oscillation signals into an output signal having an output frequency that is one of (i) a multiple of the first-reference frequency or (ii) a difference frequency that is a difference of (a) a second-reference frequency of a second-reference signal and (b) a multiple of the first-reference frequency.

These as well as other aspects and advantages will become apparent to those of ordinary skill in the art by reading the following detailed description, with reference where appropriate to the accompanying drawings.

DETAILED DESCRIPTION

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Introduction

Figure 1:
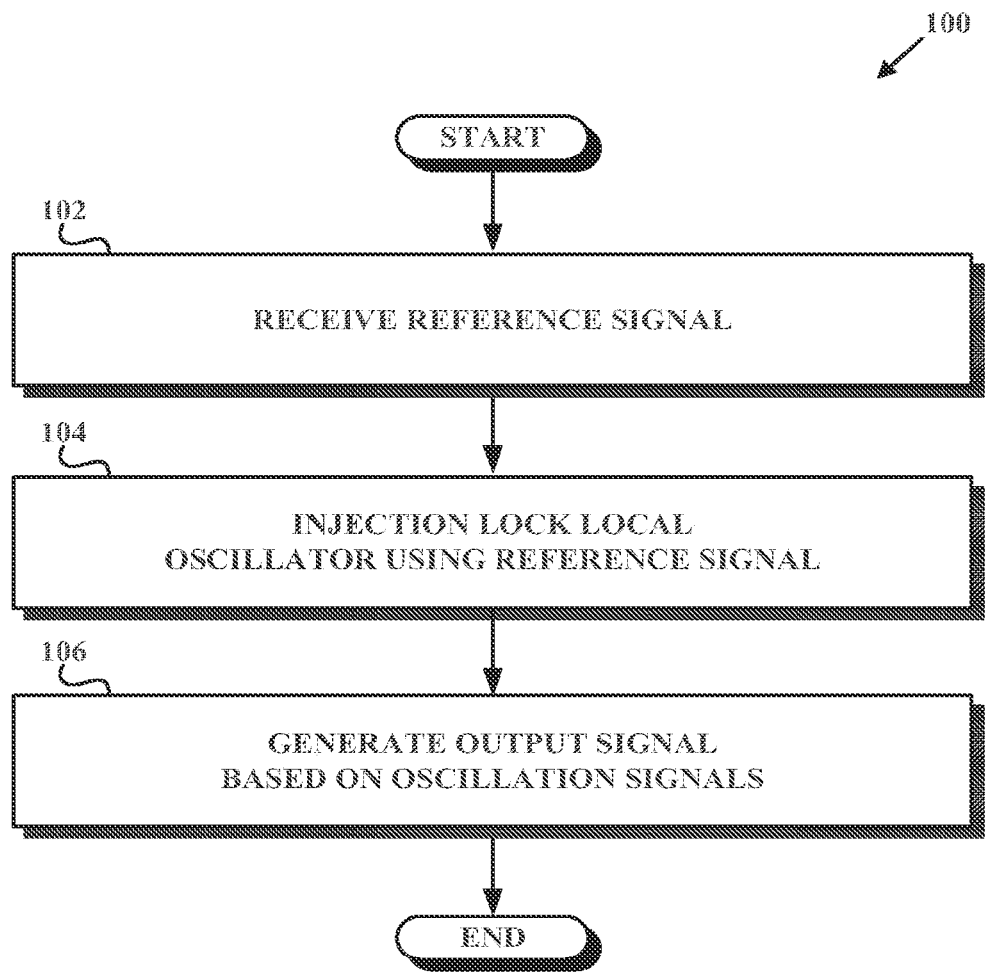
FIG. 1 depicts a flow chart of an example method that may be carried out by an example transceiver.

Described herein are aspects of a frequency-multiplying wireless transceiver that may be arranged, generally, to provide for both low-power transmission and low-power reception of wireless signals. Accordingly, certain aspects of the description herein may apply to transmitter implementations, other aspects may apply receiver implementations, and some such other aspects may apply to both transmitter and receiver implementations. Thus, at times, reference may be made to a transmitter implementation and reference may be made to a receiver implementation, although this is for purposes of explanation only. It should be understood that the wireless transceiver described herein may include any such transmitter implementation, receiver implementation, and/or combination thereof II. Example Method FIG. 1 is a flowchart of example method 100, which may be carried out by a wireless transceiver. It should be understood that the functions shown and described with respect to FIG. 1 are for purposes of example and explanation only, and should not be taken to be limiting. The various functions described with respect to FIGS. 1, including their implementation by an example wireless transceiver, are discussed in further detail below.

As shown in FIG. 1, method 100 begins at step 102 with a transceiver receiving a first-reference signal having a first-reference frequency. For example, according to a transmitter implementation, the transceiver may receive a low-frequency modulated signal.

As another example, according to a receiver implementation, the transceiver may receive a low-frequency reference-clock signal. Other examples are possible as well.

At step 104, the transceiver may use the first-reference signal to injection lock a local oscillator that provides a set of oscillation signals each having an oscillation frequency. As a result of the injection locking, the oscillation frequency will preferably be equal to the first-reference frequency (typically a low-phase noise oscillator) and the respective phases of the oscillation signals will typically exhibit low phase noise.

At step 106, the transceiver may generate an output signal based on the set of oscillation signals. For example, according to a transmitter implementation, the transceiver may combine the set of oscillation signals so as to generate an output signal having a frequency that is a multiple of the first-reference frequency. As another example, according to a receiver implementation, the transceiver may generate an output signal having a frequency that is a difference of (a) a second-reference frequency of second-reference signal, which may be a wirelessly received data signal, and (b) a multiple of the first-reference frequency.

These functions, as well as others, are described further below, with respect to an example transceiver circuit configuration.

III. Example Circuit Configuration

Figure 2:
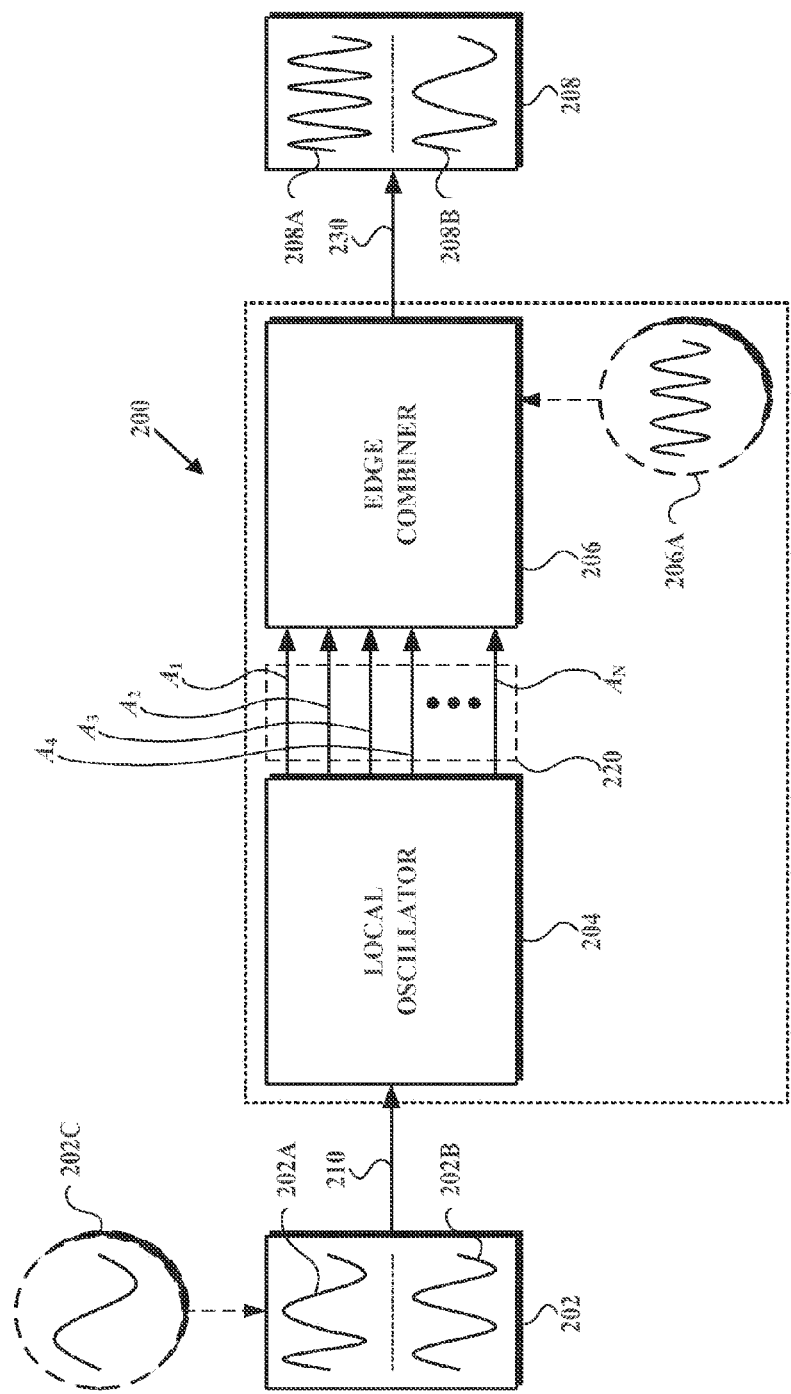
FIG. 2 depicts a simplified block diagram of functional elements included in the example transceiver.

FIG. 2 depicts a block diagram of functional elements included in example transceiver 200 that is capable of carrying out example method 100. As shown, transceiver 200 may include local oscillator 204 and edge combiner 206, which are coupled together. As described further below, transceiver 200 may include various circuitry and/or other elements as well or instead. For example, local oscillator 204 and edge combiner 206 may be coupled to reference source 202 and/or one or more output elements 208, which may be internal or external to transceiver 200. Further, each of local oscillator 204 and edge combiner 206 may include one or more circuits and/or other elements. Although the various elements of transceiver 200 may be described herein as separate elements, it should be understood that the elements could just as well be physically integrated together or distributed in any suitable manner.

Reference source 202 may be configured to provide, and local oscillator 204 may be configured to receive, first-reference signal 210. Accordingly, reference source 202 may be any suitable arrangement of circuitry and/or other elements that is arranged to generate, or otherwise provide, first-reference signal 210. In one implementation, reference source 202 may include a reference oscillator circuit arranged to generate a signal having a particular reference frequency (commonly referred to as a reference-clock signal). Examples of such a reference oscillator circuit may include various crystal oscillators, for instance a quartz oscillator. Additional examples of reference oscillator circuits may include any one, or combination of, solid state, nanoelectromechanical system (NEMS), and/or bulk acoustic wave (BAW) resonator technologies. Other examples of reference oscillator circuits, including other types of crystal oscillators, exist as well.

First-reference signal 210 provided by the reference source 202 may take various forms. For example, according to a transmitter implementation, first-reference signal 210 may be frequency-modulated reference-clock signal 202A, which is a reference-clock signal that is modulated using frequency-shift keying (FSK) based on received data signal 202C. In such a case, transceiver 200 may be arranged to process first-reference signal 210 and then wirelessly transmit output signal 230 as frequency multiplied output signal 208A (which may be considered a carrier signal). In another example, according to a receiver implementation, first-reference signal 210 may be reference-clock signal 202B, which is not modulated. In such a case, transceiver 200 may be arranged to use reference-clock signal 202B to generate a virtual local oscillator for use in downconverting a data signal, such as second-reference signal 206A, to provide output signal 230 as downconverted signal 208B. First-reference signal 210 may take other forms as well.

Note that, herein, frequencies of input and/or reference signals as well as frequencies of output signals may be referred to in the abstract. However, it should be understood that the concepts and/or techniques described herein may be applied to any suitable and/or desirable signal frequency. The concepts and/or techniques described herein may have particular applicability to the industrial, scientific, and medical (ISM) radio bands, some of which may be especially relevant to ultra-low power (ULP) wireless transceiver applications. Such ISM bands include (among others):

| Frequency Range [Hz] | Center Frequency [Hz] |
| --- | --- |
| 6.765-6.795 MHz | 6.780 MHz |
| 13553-13.567 MHz | 13.560 MHz |
| 26.957-27.283 MHz | 27.120 MHz |
| 40.66-40.70 MHz | 40.68 MHz |
| 433.05-434.79 MHz | 433.92 MHz |
| 902-928 MHz | 915 MHz |
| 2.400-2.500 GHz | 2.450 GHz |
| 5.725-5.875 GHz | 5.800 GHz |

Generally, local oscillator 204 may be configured to generate, based on first-reference signal 210, an oscillation signal set 220 that may include any suitable number of oscillation signals $A_1, A_2, A_3, A_4 \ldots A_N$. In one example, local oscillator 204 may be configured such that the oscillation signals in oscillation signal set 220 have respective phases that are equally spaced apart by a period of $T/(2N)$, where T is the period of first-reference signal 210, and N is the total number of oscillation signals in oscillation signal set 220. Local oscillator 204 may also be configured to generate oscillation signals in oscillation signal set 220 that exhibit low phase noise. In this respect, local oscillator 204 may include circuitry and/or other elements arranged so as to reduce the phase noise of the oscillation signals in oscillation signal set 220, such as one or more injection-locking circuits coupled to, and arranged to injection lock, an oscillation circuit that ultimately provides set of oscillation signals $A_1, A_2, A_3, A_4 \ldots A_N$.

Figure 3:
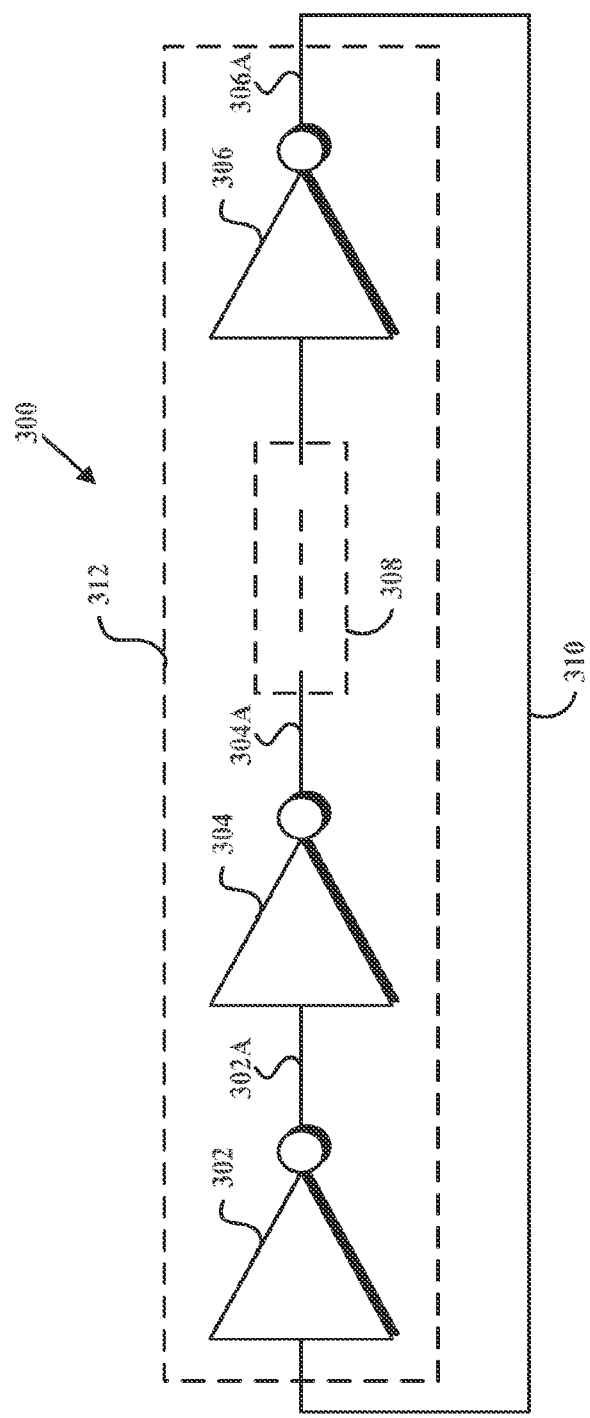
FIG. 3 depicts a simplified block diagram of an example ring oscillator configuration.

FIG. 3 depicts a simplified block diagram of an example oscillation circuit, known as a ring-oscillator circuit (or ring oscillator) 300. Such a ring oscillator may be implemented in local oscillator 204. As shown, ring oscillator 300 may include a number of delay elements 312 connected in a feedback loop 310, or "ring." A given ring oscillator, such as ring oscillator 300, is typically characterized by a "free running" frequency at which it oscillates upon being supplied with a given voltage. While ring oscillators are generally characterized by low power consumption, the signals provided at the output of each delay element may exhibit high jitter and phase noise. Thus, to minimize these undesirable phase conditions ring oscillator 300 may be injection locked as described below.

Each of delay elements 312 may be any suitable circuitry and/or other element that, in operation, introduces a delay into feedback loop 310 of ring oscillator 300. In this respect, each of delay elements 312 may function as a logical NOT gate. For example, each of delay elements 312 may be an inverter, such as one of inverters 302, 304, and 306. While only three delay elements are explicitly shown, ring oscillator 300 may include any desired odd number of such delay elements, as illustrated by ring extension 308. For example, ring oscillator 300 may include any one of three, five, seven, nine, and so on, delay elements.

Given the delay introduced into feedback loop 310 by each of delay elements 312, the signal provided at the output of a given delay element will be phase shifted relative the signal provided at the output of each other delay element. The degree of such a phase shift will generally be a function of the total number of delay elements 312 in ring oscillator 300. For example, in the three-stage ring oscillator 300, each of oscillation signals 302A, 304A and 306A will have a relative phase shift of 120 degrees. Other examples are possible as well.

As noted above, the various phases of oscillation signals 302A, 304A and 306A may exhibit an undesirable amount of jitter and phase noise. In applications where low phase noise is desired, such as may be the case with respect to transceiver 200, injection locking techniques may thus be used to reduce this phase noise.

Figure 4:
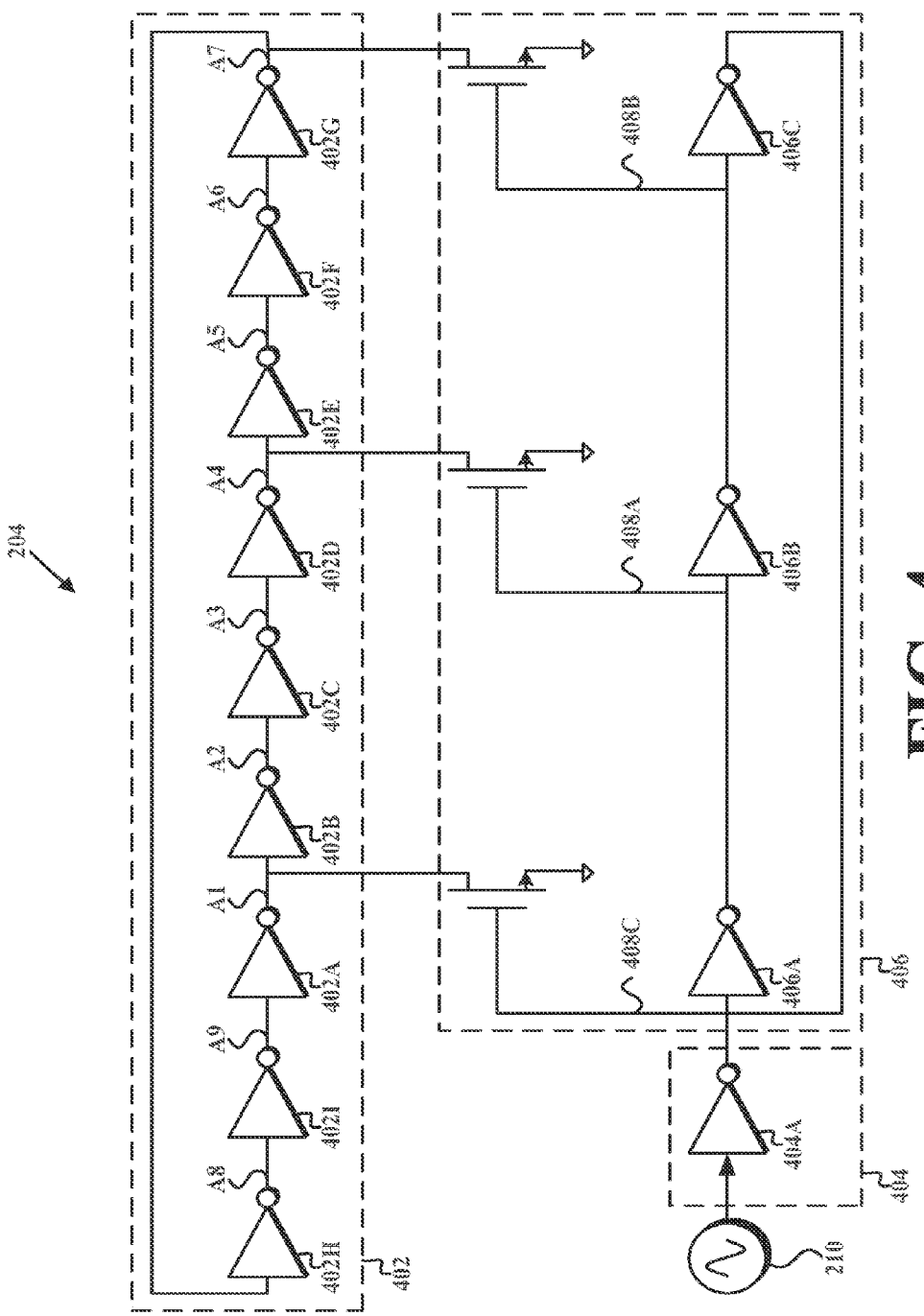
FIG. 4 depicts a simplified block diagram of an example injection-locked local oscillator configuration.

FIG. 4 illustrates local oscillator 204 as including a ring oscillator 402, a first-stage injection locking circuitry 404, and a second-stage injection locking circuitry 406. It should be noted that the particular arrangement shown in FIG. 4 is for purposes of example and explanation only and that local oscillator 204 may include additional circuitry and/or elements as well or instead. Further, although injection locking circuitry 404 and 406 are described as being included in local oscillator 204, this too is for purposes of example and explanation only. Injection locking circuitry 404 and 406 may be integrated with and/or remote from local oscillator 402 in accordance with any desired arrangement.

Ring oscillator 402 is shown as having nine delay elements 402A-402H. At the outputs, delay elements 402A-402H are arranged to provide, respectively, oscillation signals $A_1$-$A_9$, each having a unique respective phase. Preferably, such respective phases will be spaced equally apart.

As noted, for purposes of combination of oscillation signals $A_1$, $A_2$ . . . $A_9$ by edge combiner 206, it is desirable that oscillation signals $A_1$, $A_2$ . . . $A_9$ oscillate at a specifiable frequency (e.g., the first-reference frequency of first-reference signal 210) and exhibit a high degree of phase uniformity. To ensure these characteristics, first-stage injection locking circuitry 404 and second-stage injection locking circuitry 406 may provide a multi-stage injection of the frequency of reference signal 210 to ring oscillator 402.

Generally, the phenomenon of injection locking is a behavior of oscillators that can be observed in a wide variety of oscillator types. In the context of an oscillation circuit such as ring oscillator 402, injection locking generally can be achieved by injecting (that is, inputting) a signal into ring oscillator 402, which causes ring oscillator 402 to lock and track the frequency of the injected signal. As shown in FIG. 4, local oscillator 204 is configured so as to be injection locked by first-reference signal 210.

A direct, single phase, injection of first-reference signal 210 into a ring oscillator may result in the ring oscillator locking to the first-reference frequency of first-reference signal 210, and may also cause the oscillation signals provided by the ring oscillator to exhibit relatively low phase noise. However, such a direct, single phase, injection may also undesirably introduce asymmetry in the phases of the oscillation signals. Such asymmetries may have undesirable effects when combining the oscillation signals. For instance, such asymmetries may lead to large reference spurs in such a combined signal.

Accordingly, a two-stage multi-phase injection of ring oscillator 402 may be employed so as to achieve the desired frequency, low phase noise, and high symmetry in the oscillation signals provided by ring oscillator 402. As shown in FIG. 4, first injection-locking stage 404 is configured to receive first-reference signal 210, condition first-reference signal 210 by way of delay element 404A, and directly injection lock second injection-locking stage 406 using first-reference signal 210. Second injection-locking stage 406 is generally configured as a three-stage ring oscillator and, accordingly, provides oscillation signals 408A-408C at respective outputs of each of delay elements 406A-406C. Oscillation signals 408A-408C may therefore have the first-reference frequency of reference signal 210 and may also have equally-spaced phases that while having low phase noise, may be somewhat asymmetric.

Oscillation signals 408A-408C may then be symmetrically injected into ring oscillator 402 to achieve a three-phase symmetrical injection. In this way, the phase imbalance introduced by the single-phase injection (such as that provided by first injection-locking stage 404 to second injection-locking stage 406) may be attenuated. Also note that, beneficially, multiphase-injection locking such as that provided by second injection-locking stage 406 generally provides for a greater locking range of frequencies to which ring oscillator 402 may be locked (than does single phase injection) which ensures that the injection locking will be effective across pressure, volume, and temperature (PVT) variations of ring oscillator 402.

Although the injection locking described with respect to FIG. 4 includes first injection-locking stage 404 and second injection-locking stage 406, it should be understood that additional injection-locking stages may be included as well. Further, although second injection-locking stage 406 is described as involving a three-phase symmetrical injection, it should be understood that additional phases may be injected as well. For instance, second injection-locking stage 406 may include three, five, seven, nine, and so on (if local oscillator 204 included additional delay elements) phases. On the one hand, the addition of such further phase injections may further reduce the phase noise exhibited by oscillation signals $A_1$, $A_2$ . . . $A_9$. On the other hand, the addition of such further phase injections (and/or injection stages) may require the expenditure of additional power and may introduce additional noise into transceiver 200.

Figure 5:
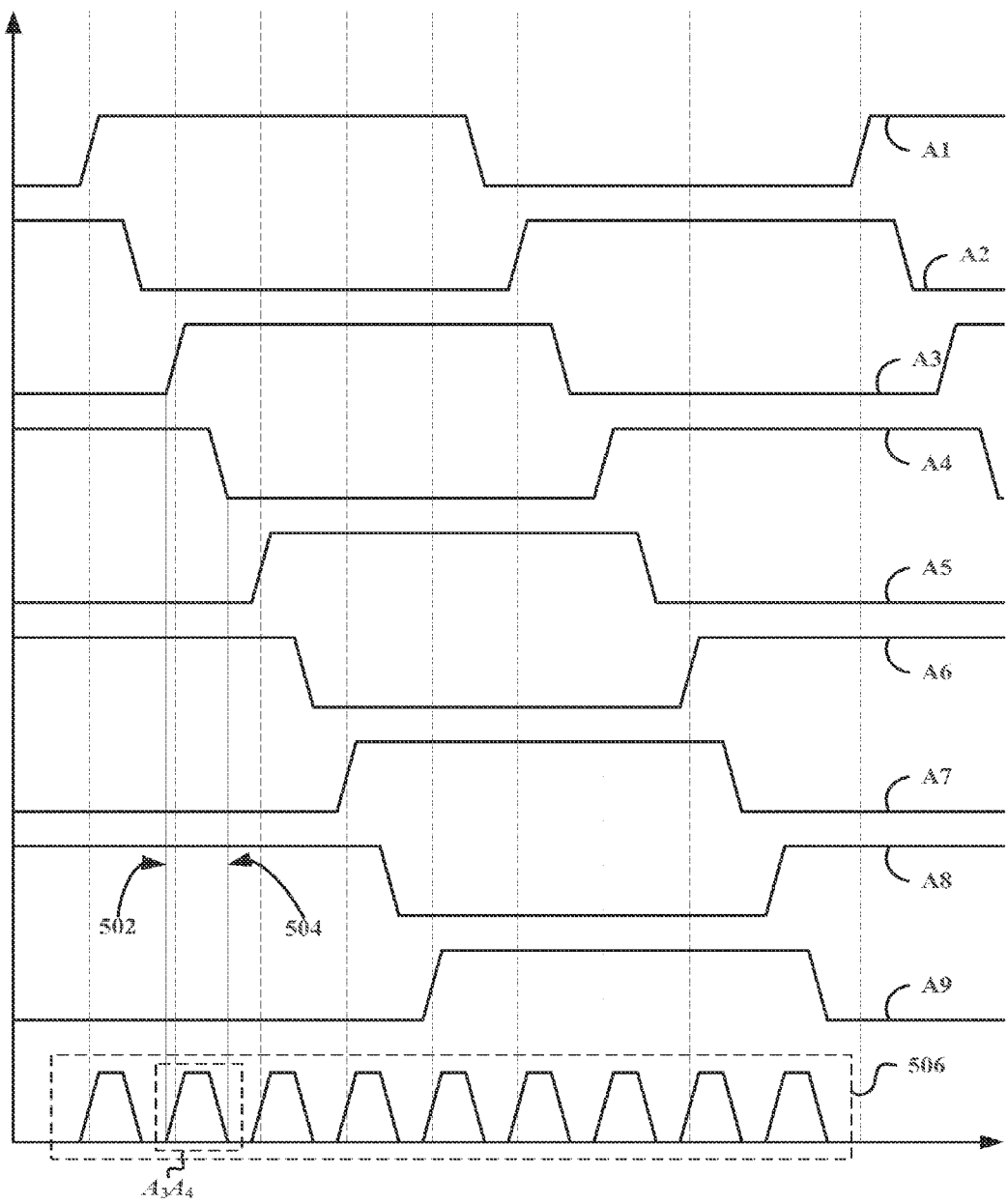
FIG. 5 depicts an example timing diagram including example oscillation signals.

In summary of the functionality of the local oscillator configuration shown in FIG. 4, each of the oscillation signals $A_1$, $A_2$ . . . $A_9$ provided by ring local oscillator 204 may each have a respective phase that is equally spaced apart by a period of T/(2N), where T is a period of first-reference signal 210 and N is the total number of oscillation signals. Note that an example of such oscillation signals $A_1$, $A_2$ . . . $A_9$ is provided in FIG. 5. As shown in FIG. 5, oscillation signals $A_1$, $A_2$ . . . $A_9$ are each equally phase offset. FIG. 5 is discussed further below with respect to edge combiner 206.

Referring back to FIG. 2, edge combiner 206 may be configured to combine oscillation signal set 220 into output signal 230. For example, according to the transmitter implementation, edge combiner 206 may be configured to generate a set of signal products $A_1A_2$, $A_2A_3$ . . . $A_NA_1$ and then generate a summation of the set of signal products to provide output signal 230. As a result, output signal 230 may have an output frequency that is equal to the instantaneous frequency of frequency-modulated reference-clock signal 202A multiplied by N, as represented by carrier signal 208A. As another example, according to the receiver implementation, edge combiner 206 may be configured to effectively mix set of signal products $A_1A_2$, $A_2A_3$ . . . $A_NA_1$ with second-reference signal 206A (which may be, for example, a data signal that has been wirelessly received by transceiver 200), and then generate a summation of the mixed set of signal products to provide output signal 230. In accordance with such an example, output signal 230 may have an output frequency that is equal to the difference of the frequency of second-reference signal 206A and the N-multiplied reference-clock signal 202B, as represented by downconverted signal 208B.

As noted, edge combiner 206 may be generally configured to generate a set of signal products $A_1A_2, A_2A_3 \ldots A_9A_1$, and to generate a summation of the set of signal products to produce output signal 230. Accordingly, edge combiner 206 may include circuitry and/or other elements for performing a logical AND operation on various pairs of oscillation signals $A_1, A_2 \ldots A_9$, so as to generate the set of signal products $A_1A_2$, $A_2A_3 \ldots A_9A_1$. Edge combiner 206 may also generally include circuitry and/or other elements for summing set of signal products $A_1A_2, A_2A_3 \ldots A_9A_1$. Such a summation amounts to a logical OR operation that combines all signal products in set of signal products $A_1A_2, A_2A_3 \ldots A_9A_1$ to produce output signal 230.

FIG. 5 provides an overview of the principles of edge combination and depicts an example timing diagram including representations of oscillation signals $A_1, A_2 \ldots A_9$ and signal products $A_1A_2, A_2A_3 \ldots A_9A_1$. More particularly, oscillation signals $A_1, A_2 \ldots A_9$ are shown as having phases that are equally offset, as provided by local oscillator 204. Also, a number of signal products 506, which includes signal products $A_1A_2, A_2A_3 \ldots A_9A_1$, are shown as corresponding to respective combinations of various pairs of oscillation signals $A_1, A_2 \ldots A_9$. As one particular example, oscillator signal $A_3$ and oscillator signal $A_4$ undergo a logical AND operation to produce signal product $A_3A_4$. Note that signal product $A_3A_4$ is defined by leading edge 502 of oscillator signal $A_3$ and falling edge 504 of oscillator signal $A_4$. Each of signal products 506 may be generated by combining signal products $A_1A_2, A_2A_3 \ldots A_9A_1$ in a similar fashion. And, ultimately, each of signal products 506 may be summed together, according to a logical OR operation, so as to produce output signal 230.

Figure 6A:
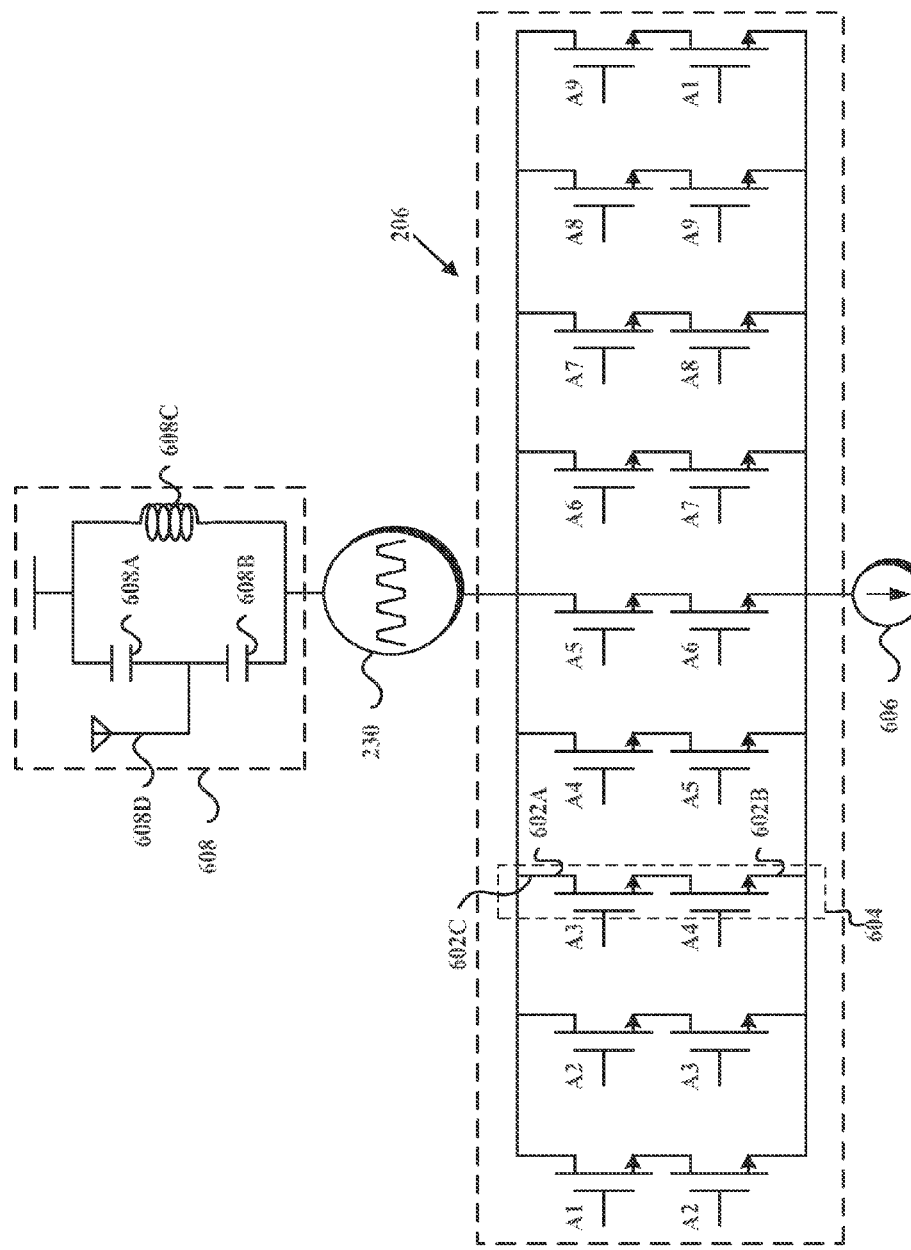
FIG. 6A depicts a simplified block diagram of an edge combiner configuration in accordance with an example transmitter implementation.
Figure 6B:
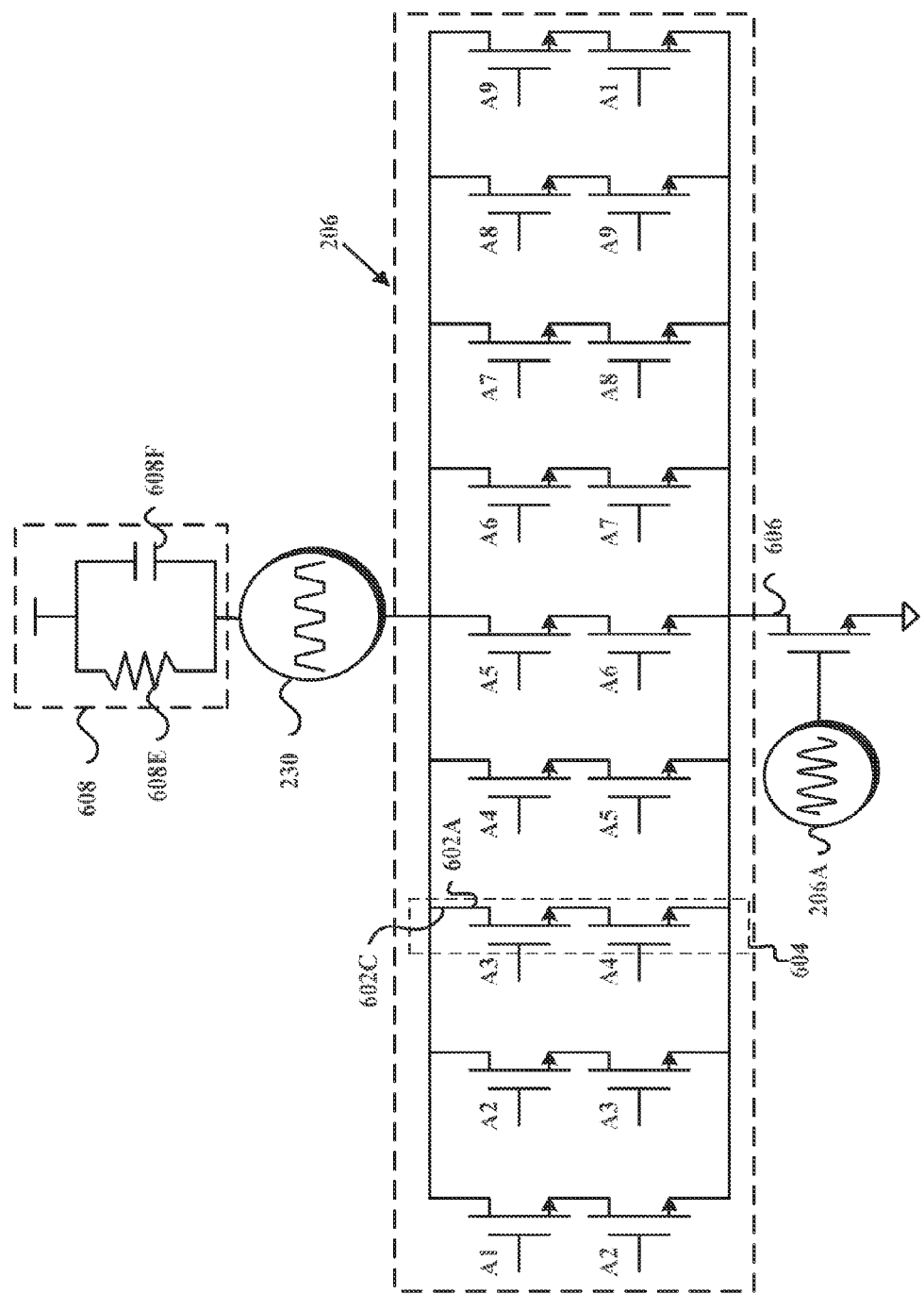
FIG. 6B depicts a simplified block diagram of an edge combiner configuration in accordance with an example receiver implementation.

FIGS. 6A and 6B depict a simplified block diagram of an edge combiner configuration in accordance with, respectively, an example transmitter implementation and an example receiver implementation of transceiver 200. The example edge combiner shown in FIGS. 6A and 6B includes a cascade of MOS transistor switch pairs. With respect to FIG. 6A, as one example, MOS transistor pair 604 includes MOS transistors 602A and 602B. As shown, MOS transistor 602A is configured to receive oscillation signal $A_3$ at its gate, and MOS transistor 602B is configured to receive oscillation signal $A_4$ at its gate. As depicted, the source of MOS transistor 602A and the drain of MOS transistor 602B are coupled together. In operation, the logical AND of oscillation signals $A_3$ and $A_4$ is provided at drain 602C of MOS transistor 602A.

The source of MOS transistor switch 602B is coupled to DC current source 606A. Thus, in the event that each of oscillation signals $A_3$ and $A_4$ go high, and each of MOS transistor switches 602A and 602B, respectively, are switched "on," a current draw is introduced at drain 602C of MOS transistor switch 602A. Each other MOS transistor pair, corresponding to signal products $A_1A_2, A_2A_3 \ldots A_9A_1$, operate in a similar fashion so as to generate each of signal products $A_1A_2, A_2A_3 \ldots A_9A_1$, at a respective drain of one MOS transistor in the MOS transistor pair. These generated signal products generally correspond, respectively to signal products 506 as shown in FIG. 5.

The generated signal products are combined by edge combiner 206 by wire ORing the cascaded MOS transistor switch pairs together. That is, the drains of each respective MOS transistor switch at which a generated signal product is provided are coupled together so as to combine the signal products into output signal 230, having a frequency nine times that of the instantaneous frequency of frequency-modulated reference-clock signal 202A. It should be noted that although local oscillator 204 is described above with respect to nine delay elements and oscillation signals, this is not necessary. Local oscillator 204 may be arranged to provide any desired number of such oscillation signals.

With respect to the receiver implementation depicted in FIG. 6B, and similar to the operation of edge combiner 106 described above with respect to the transmitter implementation, current is only allowed to flow through the cascaded MOS transistor pairs of edge combiner 206 in the event that data signal 206A goes "high" and MOS transistor switch 606 is turned on. However, in accordance with the receiver implementation, transceiver 200 may also be configured to receive second reference signal 206A via MOS transistor 602 as depicted in FIG. 6B. In particular, edge combiner 206 may receive second-reference signal 206A at the gate of MOS transistor 602. As shown, MOS transistor 602 is coupled to the available source of each of the cascaded MOS transistor pairs in edge combiner 206. In this way, current is only allowed to flow through the cascaded MOS transistor pairs of edge combiner 206 in the event that second-reference signal 206A goes "high" and MOS transistor switch is turned on.

Thus, even in the event that each of oscillation signals $A_3$ and $A_4$ go high, and each of MOS transistor switches 602A and 602B, respectively, are switched "on," a current draw is only introduced at drain 602C of MOS transistor switch 602A if MOS transistor switch 626 is "on" as well. In this way edge combiner 206 functions as a virtual local oscillator providing a virtual nine-times multiplied reference-clock signal that is mixed with data signal 206A. As a result, the difference of the frequency of second-reference signal 206A and nine times multiplied reference-clock signal 202B, is provided at the coupled available drains of the cascaded MOS transistor switch pairs of edge combiner 206. In other words, output signal 230 has a frequency that is the difference of the frequency of second-reference signal 206A and the frequency of nine times multiplied reference-clock signal 202B.

Thus, in the event, for example that the frequency of oscillation signals $A_1, A_2 \ldots A_9$ is 44.5 MHz and the frequency of data signal 206A is 402 MHz, output signal 230 would be downconverted data signal 206A having a frequency of 1.5 Mz (402 MHz-44.5 MHz×9). In this way, data signal 206A is downconverted into output signal 230 which may enable more effective, accurate, and/or efficient demodulation of data signal 206A. Subsequent to such downconversion, output signal 230 may be provided to output element 208 for demodulation in accordance with demodulation techniques known in the art.

Referring back to FIG. 2, output element 208 may generally be configured to facilitate transmitter and/or receiver functions of wireless transceiver 200, and may take any suitable form. For example, according to the transmitter implementation, output element 208 may include a wireless transmitter arranged to condition and wirelessly transmit output signal 230. As an example of such a wireless-transmitter circuit, FIG. 6A shows wireless-transmitter circuit 608. Wireless-transmitter circuit 608 includes capacitors 608A and 608B as well as inductor 608C, which form an LC tank through which the current drawn by each MOS transistor pair of local oscillator 206 flows. Capacitors 608A and 608B and inductor 608C may be tuned to the frequency of output signal 230, resulting in an effective filtration of frequencies in output signal 230 other than the fundamental. Wireless-transceiver circuit 608 also includes antennae 608D, which is matched to the impedance of edge combiner 206. In this way, wireless-transceiver circuit 608 may be arranged to transmit, by way of antennae 608D, output signal 230.

Alternatively, according to the receiver implementation, output element 208 may include a resistor 608E and capacitor 608F (RC) filter that further conditions output signal 230. Output element 208 may include other devices that carry out receiver functions including a low pass filter and/or demodulator arranged to condition and demodulate output signal 230. Such a demodulator may be coupled to edge combiner 206 so as to receive output signal 230. Output element 208 may take other forms as well.

IV. Transmitter Implementation

Figure 7A:
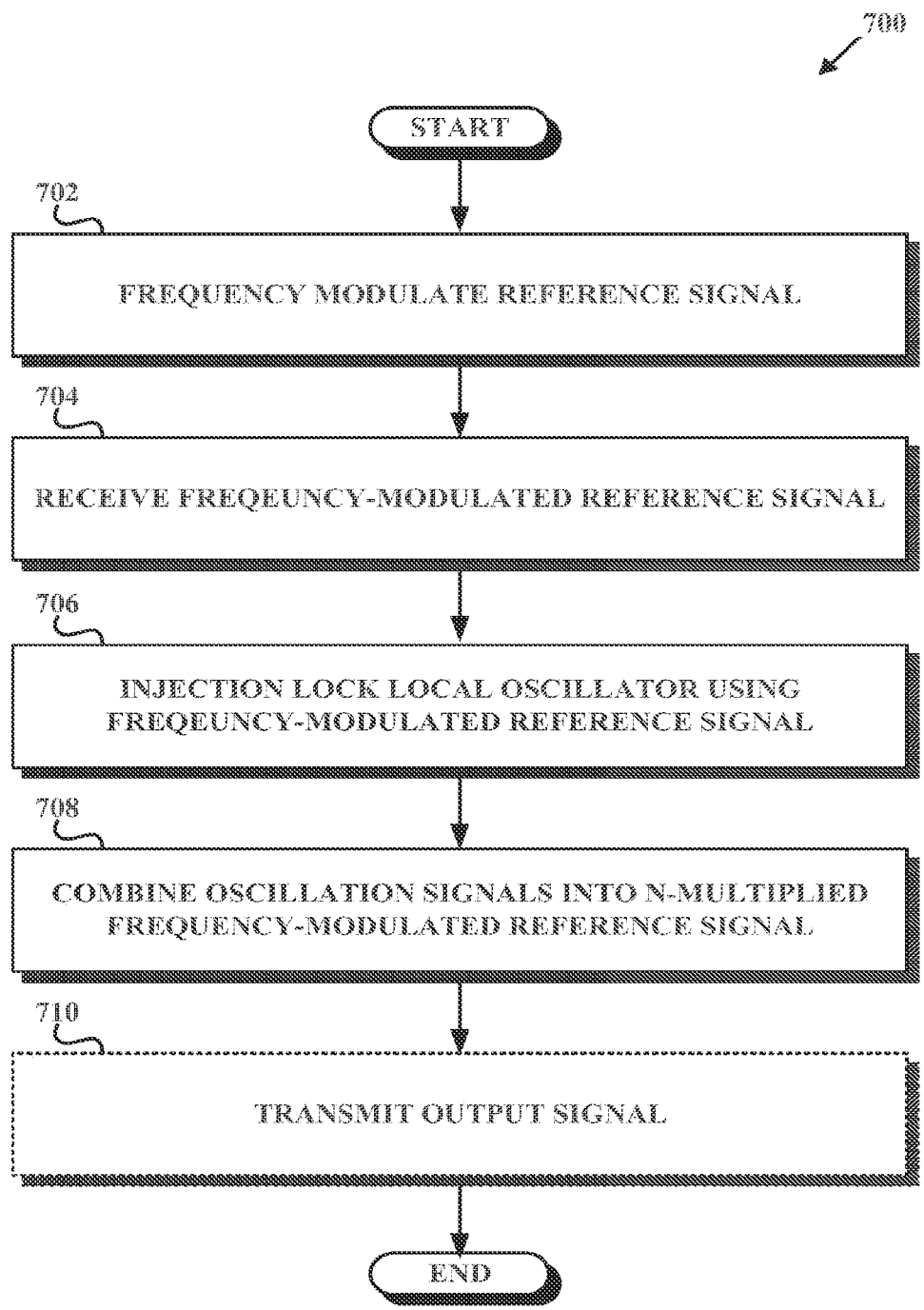
FIG. 7A depicts a flow chart of an example method that may be carried out by the example transceiver in accordance with an example transmitter implementation.

FIG. 7A is a flow chart depicting an example method 700 carried out by a transmitter implementation of transceiver 200. As shown in FIG. 7A, method 700 begins at step 702 with reference source 202 generating a first-reference signal 210 having a first-reference frequency, which will preferably be frequency-modulated reference-clock signal 202A. At step 704, transceiver 200 may receive frequency-modulated reference-clock signal 202A. At step 706, transceiver 200 may use frequency-modulated reference-clock signal 202A to injection lock local oscillator 204, which provides oscillation signal set 220 each having an oscillation frequency that is equal to the first-reference frequency. At step 708, transceiver 200 may combine oscillation signal set 220 into output signal 230 having an output frequency that is a multiple of the instantaneous frequency of the first-reference frequency (as represented by carrier signal 208A). And at step 710, transceiver 200 may optionally transmit output signal 130. The steps of method 700 are now discussed in further detail.

At step 702, reference source 202 generates first-reference signal 210 having a first-reference frequency, which may preferably be frequency-modulated reference-clock signal 202A. Preferably, reference source 202 may generate frequency-modulated reference-clock signal 202A by modulating reference-clock signal 202B with data signal 202C.

In one embodiment, reference source 202 may modulate reference-clock signal 202B with data signal 202C using frequency shift keying (FSK) modulation, and in particular by injection pulling reference-clock signal 202B using incoming data signal 202C. Like injection locking, injection pulling is a behavior of oscillators that can be observed in a wide variety of oscillator types. However, while injection locking refers to the phenomenon of a first oscillator locking a second oscillator by injecting a first-oscillator signal into the second oscillator, injection pulling refers to the phenomenon of the first oscillator disturbing the second oscillator by injecting a first-oscillator signal into the second oscillator, without necessarily causing the second oscillator to lock onto the frequency of the first-oscillator signal. Such disturbances introduce an instantaneous frequency shift in the second oscillator, and thereby, modulate the second oscillator according to the instantaneous frequency of the first oscillator. In this way, incoming data signal 202C may be encoded onto reference-clock signal 202B using FSK modulation to generate frequency-modulated reference-clock signal 202A.

Generally, data modulation techniques that involve synthesis of high-frequency signals for modulation at such high frequencies, such as carrier frequencies, are power intensive. The modulation technique disclosed herein, however, performs data modulation at a relatively low frequency, such as the frequency of reference-clock signal 102B. By performing modulation using such a low-frequency reference-clock signal, and thereby avoiding the synthesis of a high-frequency carrier signal at which data modulation is performed, power expenditures due to frequency-synthesis and high-frequency data modulation are avoided.

At step 704, transceiver 200 may receive frequency-modulated reference-clock signal 202A output by reference source 202. For example, transceiver 200 may receive frequency-modulated reference-clock signal 202A at an input of an injection-locking circuit of local oscillator 204. Other examples are possible as well.

At step 706, transceiver 200 may use frequency-modulated reference-clock signal 202A to injection lock local oscillator 204, which provides oscillation signal set 220 each having an oscillation frequency that is equal to the first-reference frequency. In one embodiment, such injection locking may be accomplished in the manner described above with respect to FIG. 4. In particular, local oscillator 204 may provide a respective one of oscillation signal set 220 at an output of a respective one of delay element set 402A-402H.

According to this embodiment, the frequency of each signal in oscillation signal set 220 will generally equal the instantaneous frequency of frequency-modulated reference-clock signal 202A. Further, oscillation signal set 220 provided by ring oscillator 204 comprises oscillation signals $A_1$, $A_2 \ldots A_9$, and that each of oscillation signals $A_1, A_2 \ldots A_9$ will have a respective phase that is equally spaced apart. In the case of nine total oscillation signals in oscillation signal set 220 (corresponding to the nine delay elements 402A-402H of ring oscillator 204), oscillation signals $A_1, A_2 \ldots A_9$ will be equally spaced apart by a period of T/18, where T is the period of frequency-modulated reference-clock signal 202A.

At step 708, transceiver 200 combines oscillation signal set 220 into output signal 230 having an output frequency that is a multiple of the first-reference frequency. As shown in FIG. 2, this output signal 230 may take the form of carrier signal 208A. In one embodiment, edge combiner 206 may combine oscillation signals 220 into output signal 230 using the cascaded MOS transistor switch arrangement depicted in FIG. 6A.

At step 710, transceiver 200 may optionally transmit output signal 230. As discussed above, such a transmission may occur using wireless transmitter circuit 608 as shown in FIG. 6A.

V. Receiver Implementation

Figure 7B:
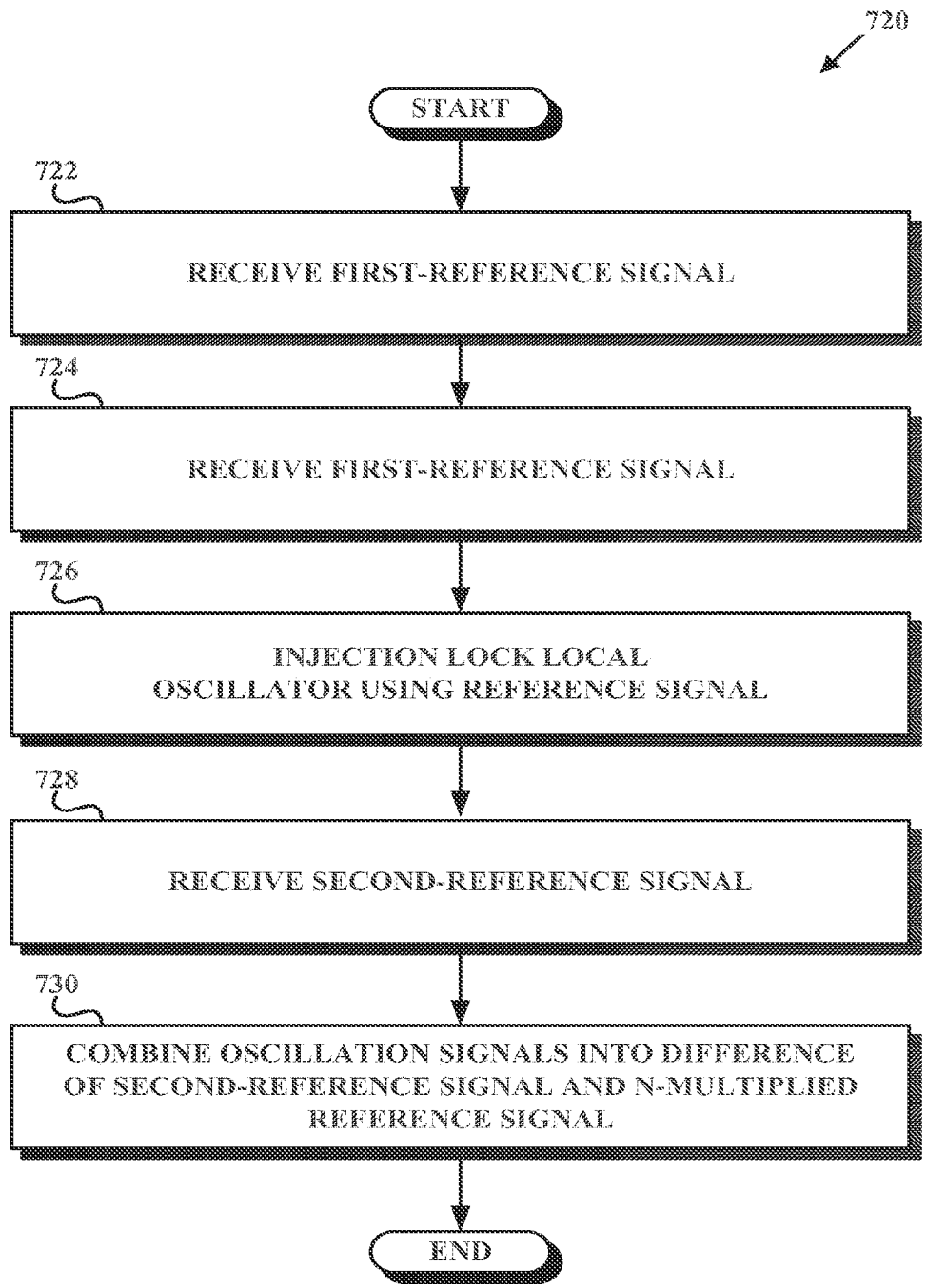
FIG. 7B depicts a flow chart of an example method that may be carried out by the example transceiver in accordance with an example receiver implementation.

FIG. 7B is a flow chart depicting an example method 720 carried out by a receiver implementation of transceiver 200. As shown in FIG. 7B, method 722 begins at step 722 with reference source 202 generating reference-clock signal 202B. At step 724, transceiver 200 may receive first-reference signal 210 having a first-reference frequency, which will preferably be reference-clock signal 202B. At step 726, transceiver 200 may use reference-clock signal 202B to injection lock local oscillator 204, which provides oscillation signal set 220 each having an oscillation frequency that is equal to the first-reference frequency. At step 728, transceiver 200 may receive second-reference signal 206A. And at step 730, transceiver 200 may combine oscillation signal set 220 into output signal 230 having an output frequency that is a difference of (a) the second-reference frequency of second-reference signal 206A and (b) a multiple of the first-reference frequency (such output signal 230 is represented by difference signal 208B). The steps of method 720 are now discussed in further detail.

At step 722, reference source 200 generates first-reference signal 210. Reference source 200 may generate first-reference signal 210 in any manner described above. For example, reference-clock signal 210 may be generated by a quartz oscillator. Other examples of reference oscillator circuits, including other types of crystal oscillators, exist as well.

At step 724 transceiver 200 receives from reference source 202 first-reference signal 210 having a first-reference frequency. For example, transceiver 200 may receive reference-clock signal 202B at the input of an injection-locking circuit, such as first injection locking circuit 204. Other examples are possible as well. At step 726, transceiver 200 uses reference-clock signal 202B to injection lock local oscillator 204, which provides oscillation signal set 220 each having an oscillation frequency, such that the oscillation frequency is equal to the first-reference frequency.

Such injection locking may be accomplished in a manner similar to that described above with respect to FIG. 4, and with step 706 of method 700. Accordingly, ring oscillator 204 may provide a respective one of oscillation signal set 220 at an output of a respective one of set of delay elements 402A-402H. Note that the frequency of each signal in oscillation signal set 220 will generally equal the frequency of reference-clock signal 202B. Further note that oscillation signal set 220 provided by ring oscillator 204 comprises oscillation signals $A_1, A_2 \ldots A_9$, and that each of oscillation signals $A_1, A_2 \ldots A_9$ will have a respective phase that is equally spaced apart. In the case of nine total oscillation signals in oscillation signal set 220 (corresponding to the nine delay elements 402A-402H of ring oscillator 204), oscillation signals $A_1, A_2 \ldots A_9$ will be equally spaced apart by a period of T/18, where T is the period of reference-clock signal 202B.

At step 728, transceiver 200 receives a second-reference signal, such as second-reference signal 206A. In one example, second reference signal 206A may be a data signal that has been wirelessly-received by transceiver 200 by any suitable receiver circuitry.

At step 730, transceiver 200 combines oscillation signal set 220 into output signal 230 having an output frequency that is a difference between (a) the second-reference frequency of second-reference signal 206A and (b) a multiple of the first-reference frequency. Such output signal 230 may be represented as signal 208B. In accordance with the receiver implementation Signal 208B may be downconverted data signal 206A, and may be received by output element 208 for further processing such as demodulation.

VI. Conclusion

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

We claim:

1. An apparatus comprising:
  a local oscillator configured to (i) receive a first reference signal having a first-reference frequency and (ii) generate, based on the received first reference signal, a set of oscillation signals, wherein each oscillation signal of the set has a respective oscillation frequency that is equal to the first-reference frequency; and
  an edge combiner coupled to the local oscillator, wherein the edge combiner is configured to combine the set of oscillation signals into an output signal, wherein the output signal has an output frequency that is (i) a multiple of the first-reference frequency or (ii) a difference frequency equal to a difference of (a) a second-reference frequency of a second-reference signal and (b) a multiple of the first-reference frequency.

2. The apparatus of claim 1, wherein the first-reference signal has a period T, wherein the set of oscillation signals comprises oscillation signals $A_1, A_2 \ldots A_N$, wherein each of the oscillation signals $A_1, A_2 \ldots A_N$ has a respective phase, and wherein the respective phases are equally spaced apart by a period of T/(2N).

3. The apparatus of claim 2, wherein the output frequency is the multiple of the first-reference frequency, and wherein the edge combiner being configured to combine the set of oscillation signals into the output signal comprises the edge combiner being configured to:
  generate a set of signal products $A_1A_2, A_2A_3 \ldots A_NA_1$; and
  generate a summation of the set of signal products to produce the output signal having an output frequency equal to the first-reference frequency multiplied by N.

4. The apparatus of claim 2, wherein the output frequency is the difference frequency, and wherein the edge combiner being configured to combine the set of oscillation signals into the output signal comprises the edge combiner being configured to:
  generate a set of signal products $A_1A_2, A_2A_3 \ldots A_NA_1$;
  mix the set of signal products with the second-reference signal; and
  generate a summation of the mixed set of signal products to produce the output signal having an output frequency equal to the difference frequency.

5. The apparatus of claim 1, wherein the first-reference signal is a frequency-shift keyed (FSK) reference-clock signal.

6. The apparatus of claim 1, the apparatus further comprising:
  a wireless transmitter coupled to the edge combiner, wherein the wireless transmitter is configured to wirelessly transmit the output signal.

7. The apparatus of claim 1, wherein the first-reference signal is a reference-clock signal.

8. The apparatus of claim 1, the apparatus further comprising:
  a wireless receiver coupled to the edge combiner, wherein the wireless receiver is configured to wirelessly receive the second-reference signal.

9. The apparatus of claim 1, wherein the second-reference signal is a modulated signal, the apparatus further comprising:
  a demodulator coupled to the edge combiner, wherein the demodulator is configured to demodulate the output signal.

10. The apparatus of claim 1, wherein the first-reference frequency is a frequency within the range of 6.765-6.795 MHz, 13.553-13.567 MHz, 26.957-27.283 MHz, 40.66-40.70 MHz, 433.05-434.79 MHz, 902-928 MHz, 2.400-2.500 GHz, or 5.725-5.875 GHz.

11. A method comprising:
  receiving a first reference signal having a first-reference frequency;
  generating, based on the received first reference signal, a set of oscillation signals, wherein each oscillation signal of the set has a respective oscillation frequency that is equal to the first-reference frequency; and
  combining the set of oscillation signals into an output signal, wherein the output signal has an output frequency that is (i) a multiple of the first-reference frequency or (ii) a difference frequency equal to a difference of (a) a second-reference frequency of a second-reference signal and (b) a multiple of the first-reference frequency.

12. The method of claim 11, wherein the first-reference signal has a period T, wherein the set of oscillation signals comprises oscillation signals $A_1, A_2 \ldots A_N$, wherein each of the oscillation signals $A_1, A_2 \ldots A_N$ has a respective phase, and wherein the respective phases are equally spaced apart by a period of $T/(2N)$.

13. The method of claim 12, wherein the output frequency is the multiple of the first-reference frequency, and wherein combining the set of oscillation signals into the output signal comprises:
   generating a set of signal products $A_1A_2, A_2A_3 \ldots A_NA_1$; and
   generating a summation of the set of signal products to produce the output signal having an output frequency equal to the first-reference frequency multiplied by N.

14. The method of claim 12, wherein the output frequency is the difference frequency, and combining the set of oscillation signals into the output signal comprises:
   generating a set of signal products $A_1A_2, A_2A_3 \ldots A_NA_1$;
   mixing the set of signal products with the second-reference signal; and
   generating a summation of the mixed set of signal products to produce the output signal having an output frequency equal to the difference frequency.

15. The method of claim 11, wherein the first-reference signal is a frequency-shift keyed (FSK) reference-clock signal.

16. The method of claim 11, further comprising wirelessly transmitting the output signal.

17. The method of claim 11, wherein the first-reference signal is a reference-clock signal.

18. The method of claim 11, further comprising wirelessly receiving the second-reference signal.

19. The method of claim 11, wherein the second-reference signal is a modulated signal, the method further comprising demodulating the output signal.

20. The method of claim 11, wherein the first-reference frequency is a frequency within the range of 6.765-6.795 MHz, 13.553-13.567 MHz, 26.957-27.283 MHz, 40.66-40.70 MHz, 433.05-434.79 MHz, 902-928 MHz, 2.400-2.500 GHz, or 5.725-5.875 GHz.

* * * * *